(12) United States Patent
Wagner

(10) Patent No.: US 8,796,114 B2
(45) Date of Patent: Aug. 5, 2014

(54) METHOD FOR SLICING A SUBSTRATE WAFER

(75) Inventor: Ralph Wagner, Neutraubling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/805,898

(22) PCT Filed: Jun. 14, 2011

(86) PCT No.: PCT/EP2011/059792
§ 371 (c)(1),
(2), (4) Date: Dec. 20, 2012

(87) PCT Pub. No.: WO2011/160977
PCT Pub. Date: Dec. 29, 2011

(65) Prior Publication Data
US 2013/0089969 A1   Apr. 11, 2013

(30) Foreign Application Priority Data
Jun. 22, 2010  (DE) .................. 10 2010 030 358

(51) Int. Cl.
*H01L 21/46*   (2006.01)
(52) U.S. Cl.
USPC .......................... 438/463; 438/458; 438/464

(58) Field of Classification Search
USPC ...................... 438/458, 459, 463, 464, 977
See application file for complete search history.

(56) References Cited

U.S. PATENT DOCUMENTS
2010/0117199 A1   5/2010   Eisele

FOREIGN PATENT DOCUMENTS
DE   10 2007 018 080   6/2008
JP   2006 245498   9/2006
WO   WO 2011/069735   6/2011

OTHER PUBLICATIONS

D. Wortmann et al., "Micro-and nanostructures inside sapphire by fs-laser irradiation and selective etching", Optics Express, vol. 16, No. 3, Jan. 1, 2008.
S. Nakamura, "The Blue Laser Diode, GaN Based Light Emitters and Lasers", Berlin, Spring, 1997, pp. 35-77, ISBN 3-540-61590-3.

*Primary Examiner* — Kevin M Picardat
(74) *Attorney, Agent, or Firm* — Cozen O'Connor

(57) ABSTRACT

A method for slicing a monocrystalline semiconductor layer (116) from a semiconductor single crystal (100) comprising: providing a semiconductor single crystal (100) having a uniform crystal structure; locally modifying the crystal structure within a separating plane (104) in the semiconductor single crystal (100) into an altered microstructure state by means of irradiation using a laser (106); and removing the modified separating plane (104) by means of selective etching.

14 Claims, 2 Drawing Sheets

US 8,796,114 B2

METHOD FOR SLICING A SUBSTRATE WAFER

RELATED APPLICATIONS

This is a U.S. National Phase Application under 35 USC 371 of International Application PCT/EP2011/059792 filed on Jun. 14, 2011.

This application claims the priority of German application no. 10 2010 030 358.5 filed Jun. 22, 2010, the entire content of which is hereby incorporated by reference.

FIELD OF THE INVENTION

The present invention relates to a method for slicing a semiconductor layer from a semiconductor single crystal.

BACKGROUND OF THE INVENTION

Thin monocrystalline semiconductor layers are often required in semiconductor technology. This is the case, for example, in the production of an optoelectronic component, such as a light emitting diode (LED). An LED is produced by means of a thin-film method, for example, wherein a thin layer of a semiconductor is deposited on a carrier, for example a sapphire glass. This regularly takes place by means of epitaxial growth of the semiconductor material. The thin layer thus applied is also designated as an epitaxial layer. Methods for this purpose are known to the person skilled in the art from document [1], for example. The deposition of the semiconductor material, for example of gallium nitride (GaN) or gallium arsenide (GaAs), by virtue of growth onto a material having other structure constants, has limitations in the quality of the crystal structure obtained. This is because, for example, dislocations or defects arise in the grown semiconductor material. Therefore, often a buffer layer is firstly applied on the carrier, said buffer layer already consisting of the semiconductor material of the epitaxial layer. However, the ground buffer layer, too, often does not have a continuously uniform crystal structure.

However, a crystal structure having the fewest possible defects is desirable in the production of components in a thin semiconductor layer. This is also referred to as a good crystal quality in this context.

SUMMARY OF THE INVENTION

One object of the present invention is to provide a method which makes it possible to produce a thin monocrystalline semiconductor layer with good crystal quality.

Various embodiments of the method comprise the following steps:

- providing a semiconductor single crystal having a uniform crystal structure;
- locally modifying the crystal structure within a separating plane in the semiconductor single crystal, into an altered microstructure state by means of irradiation using a laser;
- removing the modified separating plane by means of selective etching.

Semiconductor single crystals can be produced by a multiplicity of different methods. By way of example, semiconductor single crystals are produced by pulling from a melt. They can subsequently be sawn into individual wafers, which in turn each constitute a semiconductor single crystal. Semiconductor single crystals having good crystal quality or a uniform crystal structure can thus be provided. Such semiconductor single crystals often already serve as a basis for further processing to form a semiconductor component. However, a wafer generally has a thickness of several 100 µm.

One technique used for embodiments of the invention is to slice a plurality of thin layers of the semiconductor material from a wafer in order to use said layers for producing semiconductor components having a good quality of the crystal structure. By way of example, a sliced layer of a III-V semiconductor material can be used during the production of a semiconductor component. For this purpose, firstly a carrier, for example a sapphire crystal or some other, more easily available, semiconductor material, such as silicon, is provided. The thin semiconductor layer is applied on the carrier. It can be fixedly connected to the carrier, for example by means of a soldering or adhesive-bonding step. The semiconductor layer thus applied serves as a basis for the further production of the semiconductor component, for example by epitaxial growth of a semiconductor structure from a semiconductor material having an identical or similar lattice constant. The formation of defects of the dislocations in the epitaxial layer is largely avoided. An epitaxial layer having high quality of the crystal structure can thus be grown. This is particularly advantageous in particular in conjunction with III-V semiconductors, such as, for instance, GaAs or GaN, or semiconductors based on these materials, because these materials are difficult to produce and carriers composed of these materials are correspondingly expensive and difficult to procure. These materials find application, in particular, in discrete components, such as, for example, in power semiconductor components or in optoelectronic components, such as e.g. semiconductor lasers or light emitting diodes.

The slicing of the thin layer of semiconductor material is effected by the action of laser radiation in a separating plane of the semiconductor single crystal. The momentary action of high radiation intensity locally alters the microstructure in the crystal structure. In this case, a laser is used in order to introduce a high radiation intensity of a specific wavelength into the crystal structure. As a result of the high radiation intensity, the semiconductor material can be locally melted, for example, or the crystal structure can be altered by other processes. During subsequent cooling, an altered microstructure arises, in which the semiconductor material assumes, for example, an amorphous state, a polycrystalline state or a mixture of the two states.

The semiconductor single crystal is modified by the action of the laser in such a way that it has an altered microstructure in the region of the separating plane. By means of selective etching, the semiconductor single crystal is etched to a greater extent in the region of the altered microstructure than in the region of the crystal structure obtained. The semiconductor single crystal is thereby severed in the separating plane. This gives rise to a semiconductor layer which can be removed from the semiconductor single crystal. For its part, the semiconductor layer has a crystal structure having good quality. Moreover, the layer can be produced by means of a suitable choice of the position of the separating plane in a desired thickness or orientation of the crystal planes.

In one embodiment, a surface of the semiconductor layer which adjoins the separating plane is polished. This compensates for non-uniformities that can arise during the etching process. This is because the surface can have a certain roughness, for example, as a result of the modification by means of laser radiation. It is likewise possible for a concave surface of the semiconductor layer to be produced on account of the selective etching in a thin separating plane. A surface of the semiconductor layer that is as planar and smooth as possible can be produced by means of the polishing. By way of example, methods such as chemical mechanical polishing (CMP) are conceivable for this purpose.

In one embodiment, modifying the semiconductor single crystal is effected by focused incidence of laser radiation emitted by the laser via the top side of the semiconductor single crystal. The effect of the laser can thus be manifested in a controlled manner in the region of the separating plane. In particular, a suitable numerical aperture or else a cover glass correction required by virtue of the thickness of the semiconductor layer can be set in a controlled manner.

In one embodiment, the laser radiation comprises a picosecond or femtosecond laser radiation. It is thereby possible, in a controlled manner to introduce such high radiation powers into the separating plane that the crystal structure is modified into an amorphous or polycrystalline structure, for example.

In one embodiment, the focus of the laser radiation is introduced in a raster-like fashion over the entire separating plane. In this case, the separating plane can be progressively modified to yield a continuous modified separating plane extending continuously between the semiconductor layer to be sliced and the rest of the semiconductor single crystal.

In one embodiment, the laser radiation is focused into the region of the separating plane via an optical unit having a numerical aperture of more than 0.3, in particular of more than 0.5. The focus size of the introduced laser radiation is concomitantly determined by the numerical aperture. An effective focusing, i.e. a small focus radius (Airy disk radius), is achieved by means of the high numerical aperture. The modification in the separating plane therefore leads to a locally delimited microstructure alteration in the semiconductor single crystal. As a result, the smallest possible proportion of the semiconductor material is consumed during the slicing of the semiconductor layer by means of the method mentioned. This is a considerable advantage over known methods, such as, for example, sawing of the semiconductor single crystal, precisely in the case of semiconductor materials that are complicated to provide or can be provided only with high costs.

In one embodiment, removing the modified separating plane is effected by means of a wet-chemical method. The wet-chemical method can be effected, for example, by immersion in a reactive acid or alkaline solution. In this case, selective etching is effected in the semiconductor single crystal, wherein the reactive acid or alkaline solution reacts with the modified separating plane to a greater extent than with the rest of the semiconductor single crystal. Suitable wet-chemical methods are known to the person skilled in the art in conjunction with a wide variety of semiconductor materials. However, it is likewise possible to use dry-chemical methods or other suitable etching methods.

In one embodiment, the wet-chemical method comprises the use of a wetting agent. As a result, the etching solution used in the wet-chemical method can better enter into thin channels in the semiconductor single crystal, such that even a very thin modified separating plane can actually be removed, without the semiconductor single crystal reacting unnecessarily with the etching solution of the wet-chemical method as a result of excessively long reaction times.

In one embodiment, a carrier is fixed to the top side of the semiconductor single crystal. Such a carrier is, for example, a sapphire glass, a silicon substrate or some other suitable material which serves for mechanically stabilizing the semiconductor layer to be sliced. In one particular embodiment, the carrier is applied before wet-chemical etching such that the semiconductor layer can subsequently be removed easily and processed further. The modification of the separating plane can likewise be effected after the carrier has been fixed. In this case, the carrier and a fixing means can be transparent in the range of the laser radiation used. Alternatively, the semiconductor single crystal can be irradiated via a side situated opposite the carrier. Typically, fixing means such as a solder, for example a tin alloy, or an adhesive, for example an epoxy resin, can be used.

BRIEF DESCRIPTION OF THE DRAWINGS

Different exemplary embodiments of the method for slicing a semiconductor layer from a semiconductor single crystal are explained in greater detail below with reference to the drawings. In the figures, the first digit(s) of a reference sign indicate the figure in which the reference sign is first used. Identical reference signs are used for elements or properties that are of identical type or act identically in all the figures.

In the figures.

FIRST EXEMPLARY EMBODIMENT OF A METHOD FOR SLICING A SEMICONDUCTOR LAYER

FIG. 1a to FIG. 1d show a schematic illustration of method steps when slicing a semiconductor layer from a semiconductor single crystal in accordance with a first exemplary embodiment.

Figure 1A:
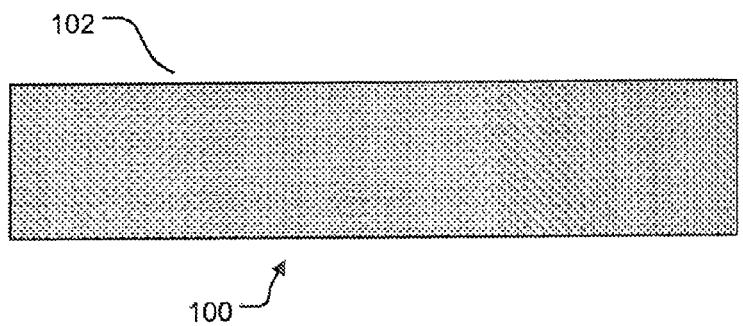
FIG. 1a to FIG. 1d show a schematic illustration of method steps when slicing a semiconductor layer from a semiconductor single crystal in accordance with a first exemplary embodiment.

A first method step involves providing a semiconductor crystal 100 illustrated in FIG. 1a. The semiconductor crystal 100 is a single crystal of a semiconductor material, in particular a III-V semiconductor material, such as, for example, GaN or GaAs. Further, for example indium-based, semiconductor materials are also used in connection with the production of optoelectronic components. The semiconductor crystal 100 is provided as a semiconductor wafer, for example. It has a surface 102.

Figure 1B:
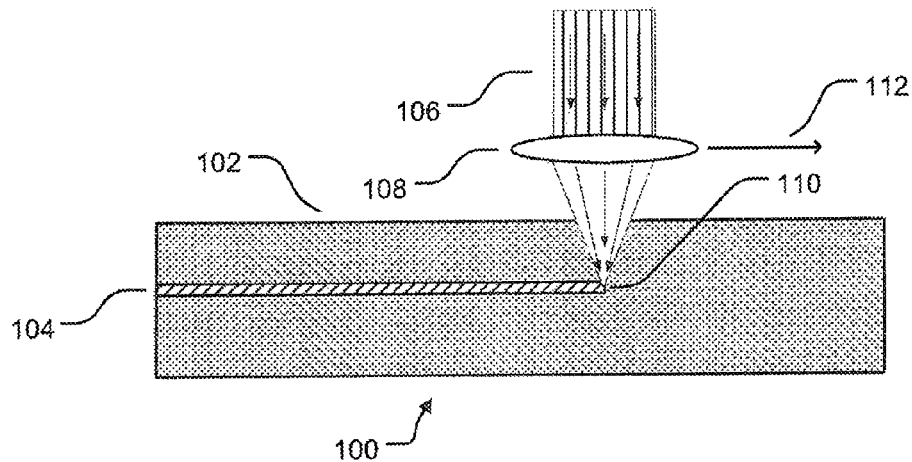

In a second method step, illustrated in FIG. 1b, a modified separating plane 104 is produced in the semiconductor crystal 100. For this purpose, the semiconductor crystal 100 is exposed to a laser radiation 106. The laser radiation 106 is focused into a focusing region 110 in the separating plane 104 via a suitable optical unit 108. The focusing region 110 has a focus diameter. The focus diameter is determined from the wavelength of the introduced laser radiation 106 and a numerical aperture of the optical unit 108 used. A picosecond or femtosecond laser radiation is typically used for the laser radiation 106. A very high energy density is thus introduced in pulses into the semiconductor single crystal 100. The crystal structure is thereby locally destroyed or modified in the focusing region 110. An altered microstructure of the semiconductor material arises upon subsequent relaxation into equilibrium. By way of example, the semiconductor material solidifies in an amorphous or vitreous phase, a polycrystalline phase or as a mixture of the phases mentioned. A modification of a crystal microstructure by means of a femtosecond laser radiation is known for a sapphire crystal from document [2], for example.

Overall it is advantageous that the laser radiation 106 used can penetrate through the semiconductor material without great losses. A wavelength of the laser radiation 106 to which the semiconductor crystal 100 is largely transparent is chosen for this purpose. A high power density of the laser radiation 106 is achieved by the concentration onto the focusing region 110. By virtue of nonlinear effects, the laser radiation 106 is at least partly absorbed in the focusing region 110. In this case, the focusing region 110 also determines the extent of the destruction of the crystal structure within the semiconductor single crystal 100. It lies in the separating plane 104, wherein a focusing error during the passage of the laser radiation 106 through the semiconductor material can be corrected, if appropriate, by means of a cover glass correction in the optical unit 108.

By way of example, a laser radiation 106 having a wavelength of between 360 nm and 1300 nm is used for modifying a GaN-based semiconductor crystal 100. In particularly advantageous embodiments, the wavelength of the laser radiation 106 is between 750 nm and 1100 nm. A typical pulse duration for the femtosecond laser radiation is between 10 fs and 1000 fs. A typical pulse energy of the laser radiation 106 is in the range of 0.1 µJ to 20 µJ. By means of a numerical aperture of more than 0.3, in particular of more than 0.5, given a diameter of the focusing region 110 of less than 10 µm, in particular less than 5 µm, a sufficient high power density is achieved in order to break up the crystal structure of the GaN-based semiconductor crystal 100. The size of the focusing region 110 is determined by the focal or Rayleigh length, which results from the numerical aperture used of the optical unit 108 used and the wavelength of the laser radiation 106 used.

The laser radiation 106 is introduced into the semiconductor crystal 100 in a raster-like fashion over the entire surface 102. For this purpose, the laser radiation 106 together with the optical unit 108 is displaced parallel to the surface 102 (indicated by an arrow 112). The surface 102 is scanned by the laser radiation 106 in such a way that the semiconductor crystal 100 is modified in a continuous separating plane 104, wherein the separating plane 104 is arranged parallel to the surface 102. However, it is also conceivable for the laser radiation 106 to scan the surface 102 in some other suitable manner, for example via a stationary optical unit 108, or for the separating plane 104 to run in an inclined fashion with respect to the surface 102. What is important is that the focusing region 110 lies within the desired separating planes 104 at any time.

Figure 1C:
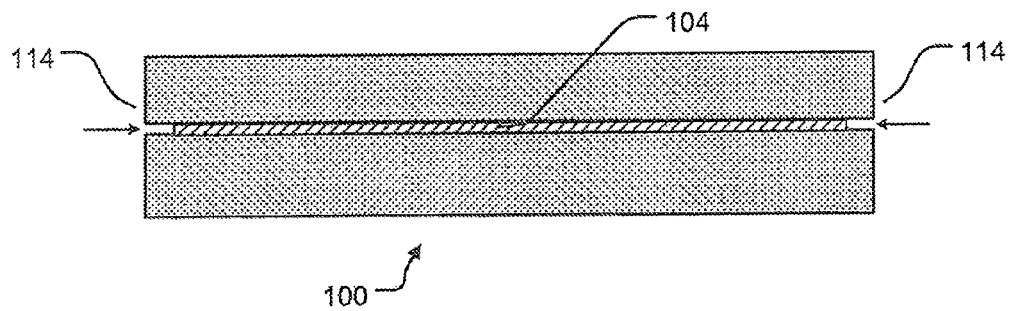

As soon as a modified separating plane 104 has been produced continuously within the semiconductor crystal 100, the modified semiconductor material is removed. This is done, as illustrated in FIG. 1c, by selective etching of the semiconductor single crystal 100. In this case, the semiconductor crystal 100 can be etched wet-chemically, for example, by being exposed to an etching solution. In particular, an etching solution is applied to the side surfaces 114 of the semiconductor crystal 100. By way of example, the semiconductor crystal 100 is dipped into an acid bath or washed round with an etching solution. Thus, a GaN-based semiconductor crystal 100 can be dipped into acid, such as, for example, hydrofluoric acid (HF), or into alkaline solution, such as, for example, potassium hydroxide (KOH). During the selective etching, the modified semiconductor material in the separating plane 104 is removed from the semiconductor single crystal 100 at a considerably higher etching rate than the rest of the semiconductor material. In the case of the system mentioned by way of example above, the ratio of the etching rates is a factor of from more than one thousand (1000) to ten thousand (10 000).

Good wetting of the modified separating plane 104 during the selective etching is advantageous. For this purpose, the etching solution has to be able to enter into the resulting channels in the separating plane 104 and also be able to be readily flushed out of said channels. A wetting agent, such as sulphonic acid or a fluorosurfactant, can advantageously be added to the etching solution. As a result, the surface tension of the etching solution is reduced and the latter can better penetrate into thin capillaries or channels and wet the modified separating plane 104 well.

Figure 1D:
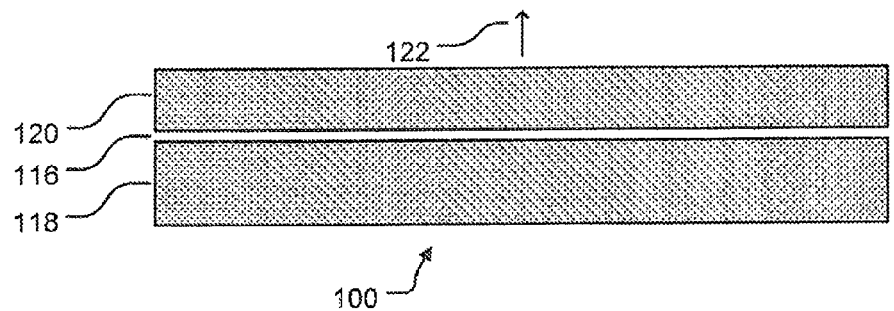

By means of the selective etching, the semiconductor crystal 100 is separated in the region of the separating plane 104. As illustrated in FIG. 1d, a separating trench 116 thus arises in the semiconductor single crystal 100, said trench separating the remaining semiconductor body 118 from a semiconductor layer 120. Since the separating trench 116 runs continuously between the semiconductor body 118 and the semiconductor layer 120, the semiconductor layer 120 can be removed from the semiconductor body 118, for example by suction, in the direction of a normal 122.

For detaching a multiplicity of individual layers from a semiconductor crystal 100 it is particularly advantageous if an etching stop layer is applied on the surfaces of the semiconductor body, and only the edge sides or the regions at the edge sides of the semiconductor body in which the etching solution is intended to penetrate into the separating plane remain free of the etching stop layer. It is thus possible to prevent the surfaces from being destroyed by long and repeated dipping in the etching solution.

The method thus makes it possible to provide one or more thin semiconductor layers 120. The semiconductor layer 120 is available for any desired application. For this purpose, that side of the semiconductor layer 120 which faces the separating trench 116 can be planarized by additional process steps, such as, for example, by means of chemical mechanical polishing (CMP) and/or by means of a heat treatment step, or defects can be eliminated at the side. The semiconductor layer 120 can be used for different applications. It can be used as a flexible carrier, for example. Likewise, for example after it has been applied to a mechanically stable carrier, it can be used as a growth substrate or as an epitaxy carrier in an epitaxy method. It is advantageous in this case, in particular, that an epitaxy carrier having the same crystal structure as the applied epitaxial layers can be provided. The formation of defects or dislocations in the epitaxial layer can thus be largely avoided.

A multiplicity of variations of the method are also conceivable. In one possible configuration, a multiplicity of parallel separating planes are modified by means of the laser radiation. Thus, a multiplicity of semiconductor layers can be sliced in one etching process. In this case, it is particularly advantageous firstly to modify the deepest separating plane and lastly to modify the topmost separating plane, in order in each case to ensure a beam path that is as homogeneous as possible for the laser radiation. In this configuration, it would additionally be conceivable for an etching stop layer to be applied on the surfaces of the semiconductor body and for only the edge sides or the regions at the edge sides of the semiconductor body in which the etching solution is intended to penetrate into the separating planes to remain free of the etching stop layer. In another development, after a semiconductor layer has been sliced, a surface of the remaining semiconductor body is planarized before a further semiconductor layer is sliced by a similar method.

SECOND EXEMPLARY EMBODIMENT OF A METHOD FOR SLICING A SEMICONDUCTOR LAYER

Figure 2A:
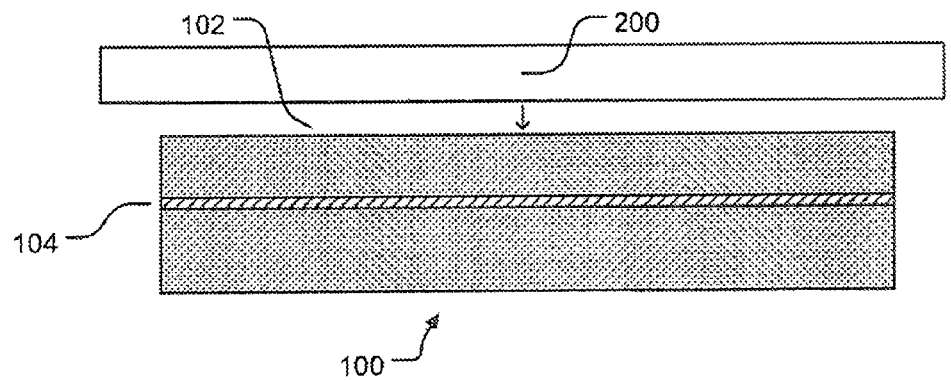
FIG. 2a to FIG. 2b show a schematic illustration of method steps when slicing a semiconductor layer from a semiconductor single crystal in accordance with a second exemplary embodiment.
Figure 2B:
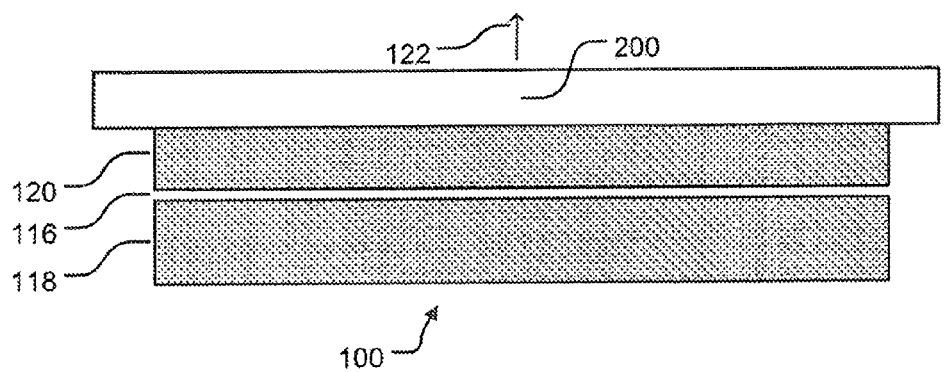

A further, preferred exemplary embodiment is described below with reference to FIG. 2a and FIG. 2b. FIG. 2a and FIG. 2b show a schematic illustration of method steps for slicing a semiconductor layer from a semiconductor single crystal 100. The method is substantially effected with the steps analogously to the first exemplary embodiment. An essential difference, however, is the fixing of a supporting carrier 200 to the semiconductor crystal 100 in order to be able to better lift off the semiconductor layer 120.

In this case, it is particularly advantageous if the supporting carrier is applied after the separating plane 104 has been modified. This is illustrated schematically in FIG. 2a. The supporting carrier 200 can be fixed to the top side 102 of the semiconductor crystal 100 for example by adhesive bonding by means of epoxy resin, by soldering using a solder having a low melting point, such as tin (Sn), for example, or eutectic bonding using an AuSn solder. Attaching the supporting carrier 200 after the separating plane 104 has been modified has the advantage that when choosing the supporting carrier 200 and the connecting material, it is not necessary to take account of special optical properties, in particular a transparency in the range of the laser radiation. Moreover, no complicated optical corrections are necessary to position the focusing region into the separating plane 104. However, it is also possible firstly to apply the supporting carrier 200 and subsequently to modify the separating plane 104 with laser radiation via the opposite side of the semiconductor crystal 100.

A sapphire glass carrier or else a silicon carrier, for example in the form of a silicon wafer, can be used as typical supporting carriers 200. The choice can likewise be made with consideration being given to ensuring that both the supporting carrier 200 and the connecting material have a coefficient of thermal expansion similar to that of the semiconductor material of the semiconductor crystal. Consideration can also be given to ensuring that the adhesion achieved between supporting carrier 200 and semiconductor material is as high as possible and lasts for as long as possible.

Furthermore, the supporting carrier 200 can be chosen from a material that is as inert as possible toward the etching solution during the subsequent selective etching. After the selective etching, the sliced semiconductor layer 120 adheres—as illustrated in FIG. 2b—to the supporting carrier 200 and has been separated from the remaining semiconductor body 118 by the separating trench 116 formed. By raising the supporting carrier 200 in the direction 122 of the normal to the surface 102, the semiconductor layer 120 can be removed from the semiconductor crystal 100 for further processing. The semiconductor layer 120 is thus ready for further processing such as has been described for example in connection with the first exemplary embodiment.

CONCLUDING STATEMENT

The method for slicing a semiconductor layer from a semiconductor single crystal has been described on the basis of some exemplary embodiments in order to illustrate the underlying concept. In this case, the exemplary embodiments are not restricted to specific combinations of features. Although some features and configurations have been described only in connection with a particular exemplary embodiment or individual exemplary embodiments, they can in each case be combined with other features from other exemplary embodiments. It is likewise possible to omit or add individual features presented or particular configurations in exemplary embodiments insofar as the general technical teaching is still realized.

LITERATURE

The following publications are cited in this document:
[1] Nakamura S. and Fasol G.: *The blue laser diode: GaN based light emitters and lasers:* Berlin; Spring, 1997. pages 35 to 77; ISBN 3-540-61590-3; and
[2] Wortmann D., Gottmann J., Brandt N. and Horn-Solle H., "Micro- and nanostructures inside sapphire by fs-laser irradiation and selective etching," Opt. Express 16, 1517-1522 (2008).

The invention claimed is:

1. A method for slicing a monocrystalline semiconductor layer from a semiconductor single crystal comprising:
providing a semiconductor single crystal having a uniform crystal structure;
locally modifying the crystal structure within a separating plane in the semiconductor single crystal into an altered microstructure state by means of irradiation using a laser; and
removing the modified separating plane by means of selective etching to produce a monocrystalline semiconductor layer.

2. The method as claimed in claim 1, further comprising:
polishing a surface of the semiconductor layer which adjoins the separating plane.

3. The method as claimed in claim 1, wherein modifying is effected by focused incidence of laser radiation emitted by the laser via the top side of the semiconductor single crystal.

4. The method as claimed in claim 3, wherein laser radiation comprises a picosecond or femtosecond laser radiation.

5. The method as claimed in claim 1, wherein a focus of the laser radiation is introduced in a raster-like fashion over the entire separating plane.

6. The method as claimed in claim 1, wherein the laser radiation is focused into the region of the separating plane via an optical unit having a numerical aperture of more than 0.5.

7. The method as claimed in claim 1, wherein the laser radiation is focused into a punctiform region in the separating plane.

8. The method as claimed in claim 1, wherein removing the modified separating plane is effected by means of a wet-chemical method.

9. The method as claimed in claim 8, wherein the wet-chemical method comprises the use of a wetting agent.

10. The method as claimed in claim 1, further comprising:
fixing a carrier to the top side of the semiconductor single crystal.

11. The method as claimed in claim 10, wherein the carrier is fixed to the top side of the semiconductor single crystal during selective etching.

12. The method as claimed in claim 1, wherein the semiconductor single crystal comprises a III-V semiconductor material.

13. The method as claimed in claim 12, wherein the III-V semiconductor material comprises gallium nitride.

14. The method as claimed in claim 1, wherein the laser radiation is focused into the region of the separating plane via an optical unit having a numerical aperture more than 0.3.

* * * * *